(12) United States Patent
Kang et al.

(10) Patent No.: US 8,410,497 B2
(45) Date of Patent: Apr. 2, 2013

(54) SEMICONDUCTOR LIGHT EMITTING DEVICE

(75) Inventors: Sang Won Kang, Suwon (KR); Seong Ju Park, Gwangju (KR); Joo Young Cho, Gwangju (KR); Il Kyu Park, Eumseong-gun (KR); Yong Chun Kim, Seongnam (KR); Dong Joon Kim, Suwon (KR); Jeong Tak Oh, Yongin (KR); Je Won Kim, Seoul (KR)

(73) Assignee: Samsung Electronics Co., Ltd., Seoul (KR)

( * ) Notice: Subject to any disclaimer, the term of this patent is extended or adjusted under 35 U.S.C. 154(b) by 317 days.

(21) Appl. No.: 12/338,438

(22) Filed: Dec. 18, 2008

(65) Prior Publication Data

US 2010/0019258 A1    Jan. 28, 2010

(30) Foreign Application Priority Data

Jul. 22, 2008    (KR) .................. 10-2008-0071298

(51) Int. Cl.
*H01L 33/00*    (2010.01)
(52) U.S. Cl. ............... 257/96; 257/103; 257/E33.013
(58) Field of Classification Search ............ 257/96, 257/103, E33.013
See application file for complete search history.

(56) References Cited

U.S. PATENT DOCUMENTS

| 6,051,849 | A | 4/2000 | Davis et al. |
| 7,132,691 | B1 * | 11/2006 | Tanabe et al. .................. 257/79 |
| 7,250,631 | B2 * | 7/2007 | Yoneda ........................... 257/79 |
| 8,026,118 | B2 * | 9/2011 | Shinohara et al. .............. 438/46 |
| 2008/0237619 | A1 * | 10/2008 | Epler et al. ..................... 257/98 |
| 2009/0261376 | A1 * | 10/2009 | Hwang ......................... 257/103 |

FOREIGN PATENT DOCUMENTS

JP    2001-326384    11/2001

* cited by examiner

*Primary Examiner* — Calvin Lee
*Assistant Examiner* — Monica D Harrison
(74) *Attorney, Agent, or Firm* — McDermott Will & Emery LLP

(57) ABSTRACT

There is provided a semiconductor light emitting device that can easily dissipate heat, improve current spreading efficiency, and reduce defects by blocking dislocations occurring when a semiconductor layer is grown to thereby increase reliability. A semiconductor light emitting device including a substrate, a light emitting structure having an n-type semiconductor layer, an active layer, and a p-type semiconductor layer sequentially laminated, and an n-type electrode and a p-type electrode formed on the n-type semiconductor layer and the p-type semiconductor layer, respectively, according to an aspect of the invention may include: a metal layer formed in the n-type semiconductor layer and contacting the n-type electrode.

15 Claims, 7 Drawing Sheets

SEMICONDUCTOR LIGHT EMITTING DEVICE

CROSS-REFERENCE TO RELATED APPLICATIONS

This application claims the priority of Korean Patent Application No. 2008-0071298 filed on Jul. 22, 2008, in the Korean Intellectual Property Office, the disclosure of which is incorporated herein by reference.

BACKGROUND OF THE INVENTION

1. Field of the Invention

The present invention relates to semiconductor light emitting devices, and more particularly, to a semiconductor light emitting device that can easily dissipate heat, improve current spreading efficiency, and reduce defects by blocking dislocations occurring when a semiconductor layer is grown to thereby increase reliability.

2. Description of the Related Art

Semiconductor light emitting devices emit light when a current passes therethrough. The semiconductor light emitting devices have appeared as the core material in different light industries ranging from lighting and traffic lights to backlight light sources of liquid crystal displays (LCDs). Semiconductor light emitting devices are the next generation light sources in consideration of energy savings and environmental protection since they emit light of desired color (wavelength) with low power consumption but do not emit hazardous substances, such as mercury. These semiconductor light emitting devices are widely used as lighting, display devices, and light sources, and the development thereof has been expedited.

In particular, the widespread use of cellular phone keypads, side viewers, and camera flashes, which use gallium nitride (GaN) light emitting diodes that have been actively developed and widely used, contributes to the active development of general lighting that uses light emitting diodes. Applications of the light emitting diodes, such as backlight units of large TVs, headlights of cars, and general lighting, have advanced from small portable products to large products having high power, high efficiency, and high reliability. Therefore, there has been a need for light sources that have characteristics satisfying corresponding products.

A nitride semiconductor grown on a generally used sapphire substrate have poor heat dissipation characteristics to dissipate heat generated from the device since sapphire has low thermal conductivity. In a case of an optical semiconductor that is grown on a sapphire substrate, long-term reliability is degraded when the optical semiconductor is operated at high current density due to the poor heat dissipation characteristics. Therefore, there has been a need to solve the heat dissipation problem.

SUMMARY OF THE INVENTION

An aspect of the present invention provides a semiconductor light emitting device that can easily dissipate heat, improve current spreading efficiency, and reduce defects by blocking dislocations occurring when a semiconductor layer is grown to thereby increase reliability.

According to an aspect of the present invention, there is provided a semiconductor light emitting device including a substrate, a light emitting structure having an n-type semiconductor layer, an active layer, and a p-type semiconductor layer sequentially laminated, and an n-type electrode and a p-type electrode formed on the n-type semiconductor layer and the p-type semiconductor layer, respectively, the semiconductor light emitting device including: a metal layer formed in the n-type semiconductor layer and contacting the n-type electrode.

The substrate may include sapphire or spinel. The substrate may include any one of SiC, Si, ZnO, GaAs, and GaN.

The metal layer may be in contact with the active layer. The metal layer may comprise a pattern. The pattern may be a striped pattern or a mesh pattern.

The metal layer may comprise a metal having a higher melting point than a growth temperature of a semiconductor forming the semiconductor layer. The semiconductor may be GaN, and the metal may have a melting point of 1000° C. or higher. The metal may include at least one of Mo, Nb, Os, Re, Pd, W, Ta, Cr, Hf, Rh, and Zr.

The metal layer may have a multilayer structure. The metal layer may have the multilayer structure including at least one layer formed of Cr. The metal layer may has the multilayer including at least one layer formed of at least one of Mo, Nb, Os, Re, Pd, W, Ta, Cr, Hf, Rh and Zr. At least one layer, located closest to the active layer, of the multi-layered metal layer may be formed of Rh.

The metal layer having the multilayer structure may include a first layer formed of Cr, a second layer formed of at least one of Mo, Nb, Os, Re, Pd, W, Ta, Cr, Hf, Rh, and Zr, and a third layer formed of Rh, the first, second, and third layers sequentially laminated.

The semiconductor light emitting device may further include a buffer layer between the substrate and the n-type semiconductor layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
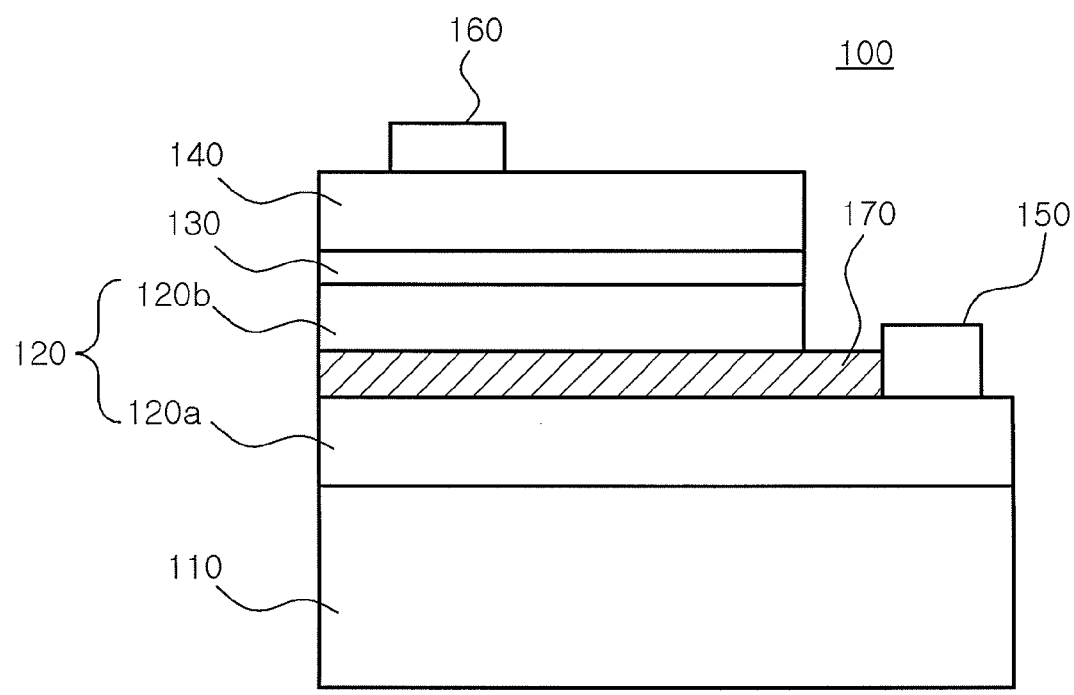
FIG. 1 is a cross-sectional view illustrating a semiconductor light device according to an exemplary embodiment of the invention.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a cross-sectional view illustrating a semiconductor light emitting device according to an exemplary embodiment of the invention. A light emitting device 100 according to this embodiment includes a substrate 110, an n-type semiconductor layer 120, an active layer 130, a p-type semiconductor layer 140, an n-type electrode 150 formed on the n-type semiconductor layer 120, a p-type electrode 160 formed on the p-type semiconductor layer 140, and a metal layer 170 formed inside the n-type semiconductor layer 120 and contacting the n-type electrode 150. Here, the n-type semiconductor layer 120, the active layer 130, and the p-type semiconductor layer 140 are sequentially laminated to form a light emitting structure. In FIG. 1, the semiconductor light emitting device 100 is shown as a horizontal semiconductor light emitting device. However, the invention is not limited thereto.

To manufacture the semiconductor light emitting device 100, the n-type semiconductor layer 120 is first formed on the substrate 110. The substrate 110 may be a growth substrate for growing the light emitting structure or a support substrate for supporting the light emitting structure. The substrate 110 may be a sapphire substrate having the c-plane, the r-plane, and the a-plane as major surfaces or a non-conductive substrate formed of spinel ($MgAl_2O_4$), a semiconductor substrate formed of SiC, Si, ZnO, GaAs, or GaN, or a conductive substrate such as a metal substrate. Among them, the conductive substrate, such as a Ni, Cu or Si substrate, is used as a vertical semiconductor light emitting device.

The n-type semiconductor layer 120 is formed of semiconductors, such as a GaN-based semiconductor, a ZnO-based semiconductor, a GaAs-based semiconductor, a GaP-based semiconductor, and a GaAsP-based semiconductor. The semiconductor layer may be performed by a known layer forming method, such as molecular beam epitaxy (MBE). The semiconductor layers may be appropriately selected from a group consisting of group III-V semiconductors, group II-VI semiconductors, and Si.

An impurity of the n-type semiconductor layer 120 may be one selected among Si, Ge, and Sn. Preferably, an n-type impurity has a concentration of 3E18 or higher. As the n-type impurity has a higher concentration, a forward voltage (hereinafter, referred to as "Vf") is decreased within a range where the crystallinity is not reduced. When the concentration of n-type impurity is excessive, the crystallinity is reduced. The crystallinity is reduced at a concentration of 5E21 or higher. Preferably, the concentration of impurity needs to be appropriately adjusted in terms of the Vf and the crystallinity.

When the n-type semiconductor layer 120 is formed, the metal layer 170 is located therein. The metal layer 170 is a refractory metal thin film, and may have a thickness of several nanometers.

Further, the metal layer 170 includes metal having a melting point higher than a growth temperature of semiconductors forming the semiconductor layers. For example, when the n-type semiconductor layer 120 contains GaN, the metal included in the metal layer 170 may have a melting point of 1000° C. or higher. An example of the metal may include Mo, Nb, Os, Re, Pd, W, Ta, Cr, Hf, Rh or Zr. The metal layer 170 will be described in detail with reference to FIGS. 2 through 6.

In FIG. 1, when the n-type semiconductor layer formed on the substrate 110 is an upper n-type semiconductor layer 120b, the metal layer 170 is formed on a lower n-type semiconductor layer 120a, and the upper n-type semiconductor layer 120b is formed on the metal layer 170. The metal layer 170 is in contact with the n-type electrode 150 formed on the lower n-type semiconductor layer 120a. As long as the metal layer 170 is located within the n-type semiconductor layer 120, the metal layer 170 may be in contact with the substrate 110 or the active layer 130.

The active layer 130 is formed on the upper n-type semiconductor layer 120b. Since the active layer 130 has a higher energy band gap than each of the n-type semiconductor layer 120 and the p-type semiconductor layer 140, thereby activating light emission. Here, because of characteristics of the active layer 130, the active layer 130 is not preferably doped with impurities. A wavelength of emitted light can be controlled by adjusting a molar ratio of materials. Therefore, the semiconductor light emitting device 100 may emit any one of infrared light, visible light, and ultraviolet light according to the characteristics of the active layer 130.

The active layer 130 may have a plurality of well layers (not shown) or a plurality of barrier layers (not shown). For example, the active layer 130 may be formed of barrier layers formed of undoped GaN and well layers formed of undoped InGaN. GaN and InGaN layers may be alternately laminated on each other in the active layer 130 to form quantum well layers. A wavelength or quantum efficiency can be controlled by adjusting the height of barrier layers (not shown), thickness and composition of well layers (not shown), and the number of quantum wells.

The p-type semiconductor layer 140 may include a semiconductor such as a GaN-based semiconductor, a ZnO-based semiconductor, a GaAs-based semiconductor, a GaP-based semiconductor, and a GaAsP-based semiconductor. The semiconductor layer may be formed by using a known layer forming method, for example, molecular beam epitaxy (MBE). Further, the p-type semiconductor layer 140 may be appropriately formed of a material selected from a group consisting of a group III-V semiconductor, a group II-VI semiconductor, and Si. An example of an impurity of the p-type semiconductor layer 140 may include Mg, Zn or Be, and preferably, Mg. A transparent electrode (not shown), such as ITO, may be formed on the p-type semiconductor layer 140 so as to perform current spreading.

The n-type electrode 150 and the p-type electrode 160 are formed on the n-type semiconductor layer 120 and the p-type semiconductor layer 140, respectively. Each of the n-type electrode 150 and the p-type electrode 160 maybe formed of metal. For example, the n-type electrode 150 may be formed of Ti, and the p-type electrode 160 may be formed of Pd or Au.

In FIG. 1, the p-type semiconductor layer 140, the active layer 130, and the n-type semiconductor layer 120 are mesa-etched to expose an upper portion of the n-type semiconductor layer 120 to the outside, and the n-type electrode 150 is formed on the exposed upper portion. Therefore, the metal layer 170 is formed on the n-type semiconductor layer 120, is extended to the exposed upper portion of the n-type semiconductor layer 120, and is in contact with the n-type electrode 150. The metal layer 170 contains metal with high conductivity to conduct electrons injected from the n-type semiconductor layer 120 in contact with the n-type electrode 150.

Figure 2:
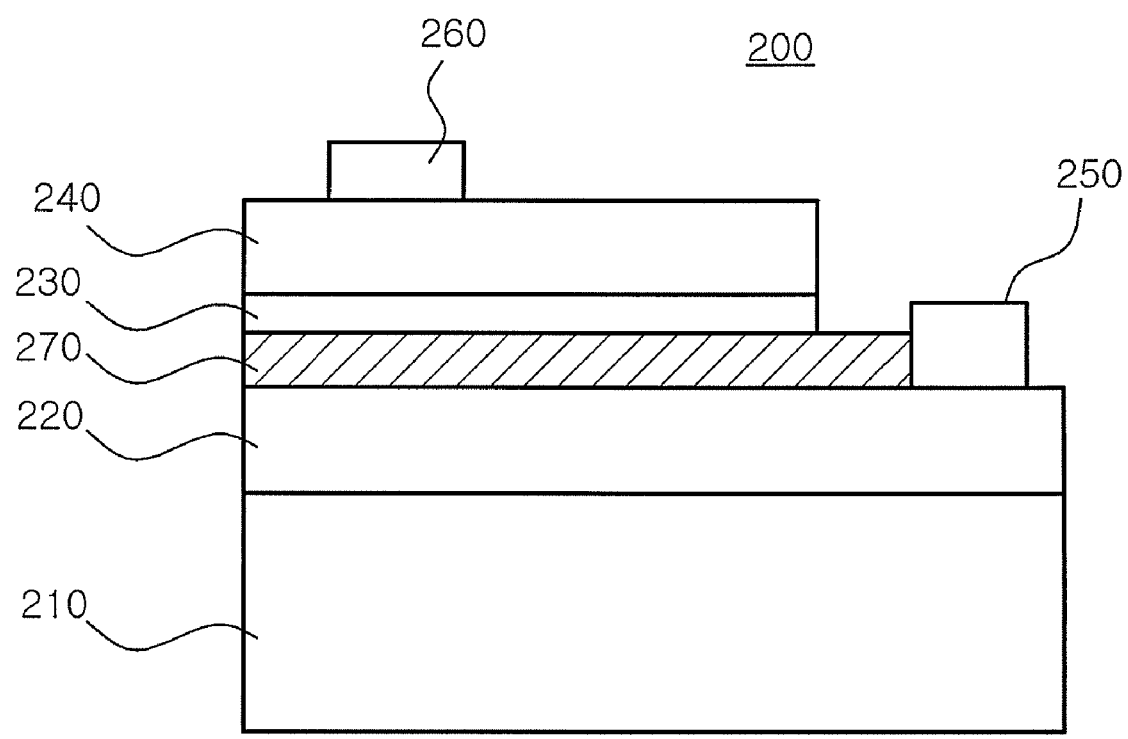
FIG. 2 is a cross-sectional view illustrating a semiconductor light emitting device having a metal layer in contact with an active layer according to another exemplary embodiment of the invention.

FIG. 2 is a cross-sectional view illustrating a semiconductor light emitting device 200 having a metal layer in contact with an active layer according to another exemplary embodiment of the invention. Here, the semiconductor light emitting device 200, shown in FIG. 2, includes a substrate 210, an n-type semiconductor layer 220, an active layer 230, a p-type semiconductor layer 240, an n-type electrode 250, and a p-type electrode 260. The semiconductor light emitting device 200 is the same as the light emitting device 100, shown in FIG. 1, except that the metal layer 270 is located within the n-type semiconductor layer 220 but at the same time, is in contact with the active layer 230. Therefore, a description of the same components will be omitted.

In this embodiment, the metal layer 270 is in contact with the active layer 230. The active layer 230, which mainly emits light, is expected to generate the largest amount of heat. For this reason, when the metal layer 270 is in direct contact with the active layer 230, the active layer 230 can efficiently dissipate heat generated from the active layer 230. Further, since the metal layer 270 can efficiently dissipate the electrons injected into the active layer 230 and supply the electrons, efficient light emission of the active layer 230 can be provided.

Figure 3:
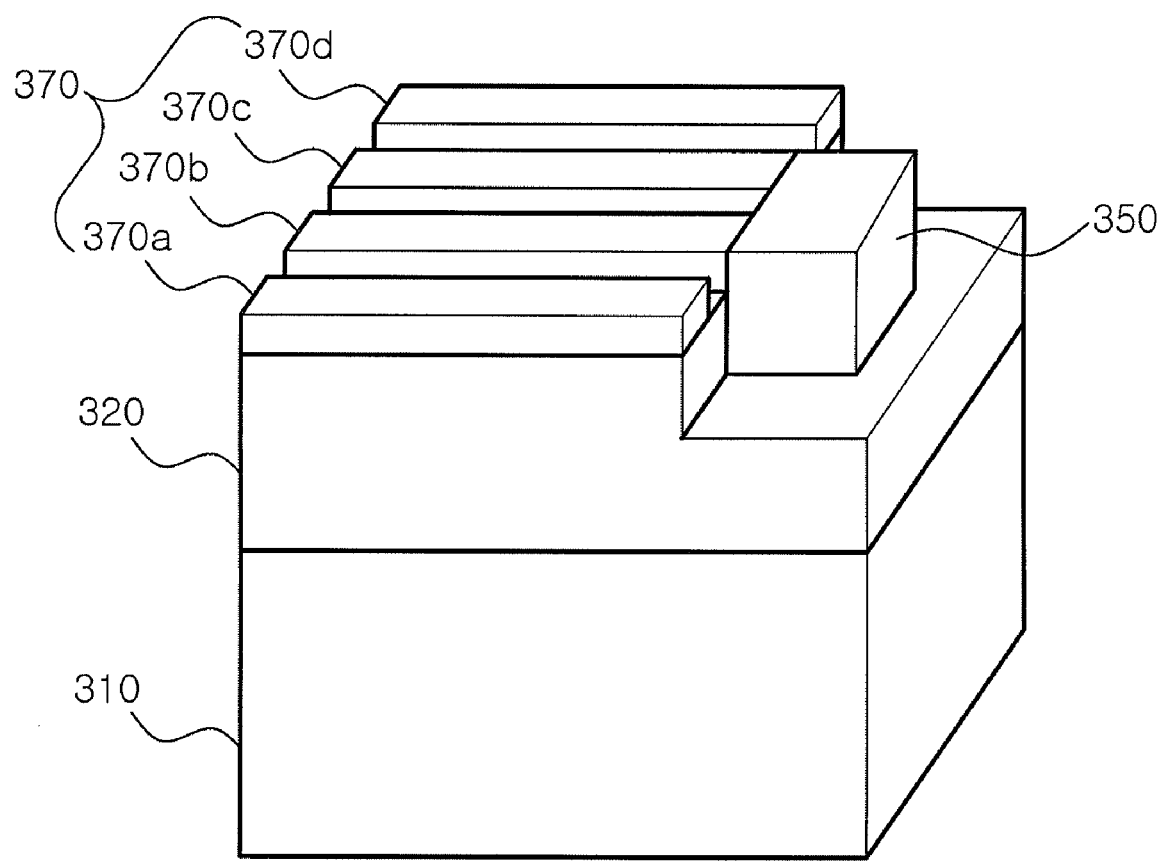
FIG. 3 is a perspective view illustrating a semiconductor light emitting device having a metal layer including a striped pattern according to still another exemplary embodiment of the invention.
Figure 4:
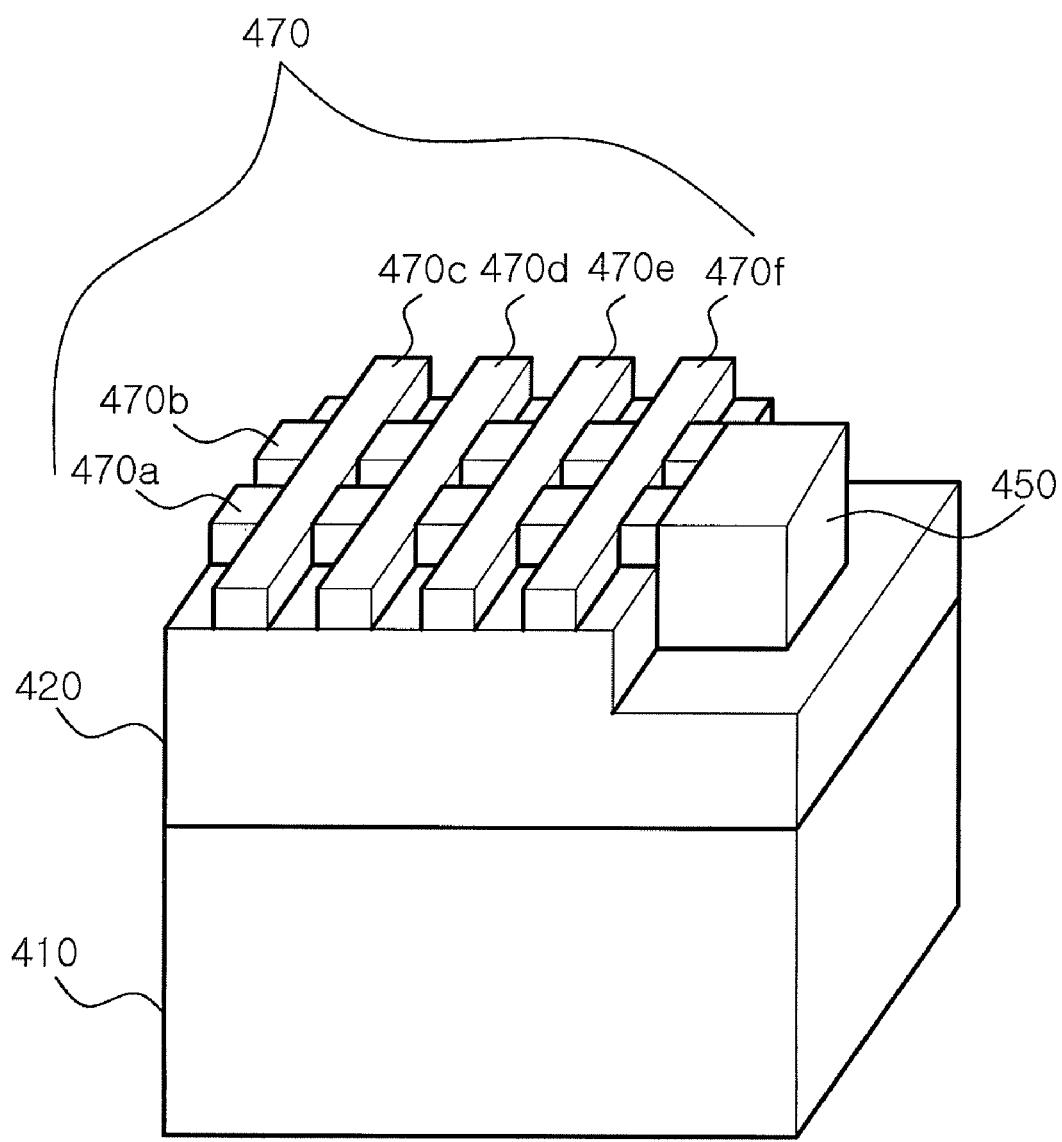
FIG. 4 is a perspective view illustrating a semiconductor light emitting device having a metal layer including a mesh pattern according to yet another exemplary embodiment of the invention.

FIG. 3 is a perspective view illustrating a semiconductor light emitting device having a striped pattern according to still another exemplary embodiment of the invention. FIG. 4 is a perspective view illustrating a semiconductor light emitting device having a mesh pattern according to yet another exemplary embodiment of the invention. In FIGS. 3 and 4, an upper n-type semiconductor layer, an active layer, a p-type semiconductor layer, and a p-type electrode are removed for the convenience of explanation. Here, in FIGS. 3 and 4, substrates 310 and 410, n-type semiconductor layers 320 and 420, and n-type electrodes 350 and 450 in the respective semiconductor light emitting devices are shown. Since all of the components are the same as described above with reference to FIG. 1, a description thereof will be omitted.

In FIG. 3, a metal layer 370 has a striped pattern. The metal layer 370 has four stripe patterns 370a, 370b, 370c, and 370d. Some patterns of the four patterns, that is, the stripe patterns 370b and 370c are in contact with the n-type electrode 350. The n-type semiconductor layer 320 may be further formed as a filler between the stripe patterns of the metal layer 370. However, this is not shown in the drawings in order to clearly illustrate the pattern shapes. When the metal layer 370 has the striped pattern, current spreading from the n-type electrode 350 is facilitated, and thus the current can be easily supplied to the active layer 330.

In FIG. 4, a metal layer 470 has a mesh pattern. The mesh pattern of the metal layer 470 has a lattice shape including horizontal patterns 470a and 470b and vertical patterns 470c, 470d, 470e, and 470f. Here, like FIG. 3, the n-type semiconductor layer 420 may be formed as a filler between the patterns of the metal layer 470, which is omitted to clearly describe the pattern shape. When the metal layer 470 has a mesh pattern, defects caused by dislocations occurring when the n-type semiconductor layer 420 is grown can be efficiently prevented.

The striped pattern and the mesh pattern may be formed on the metal layers 370 and 470 in such a way that a metal film is grown, and then photolithograph is performed.

Figure 5:
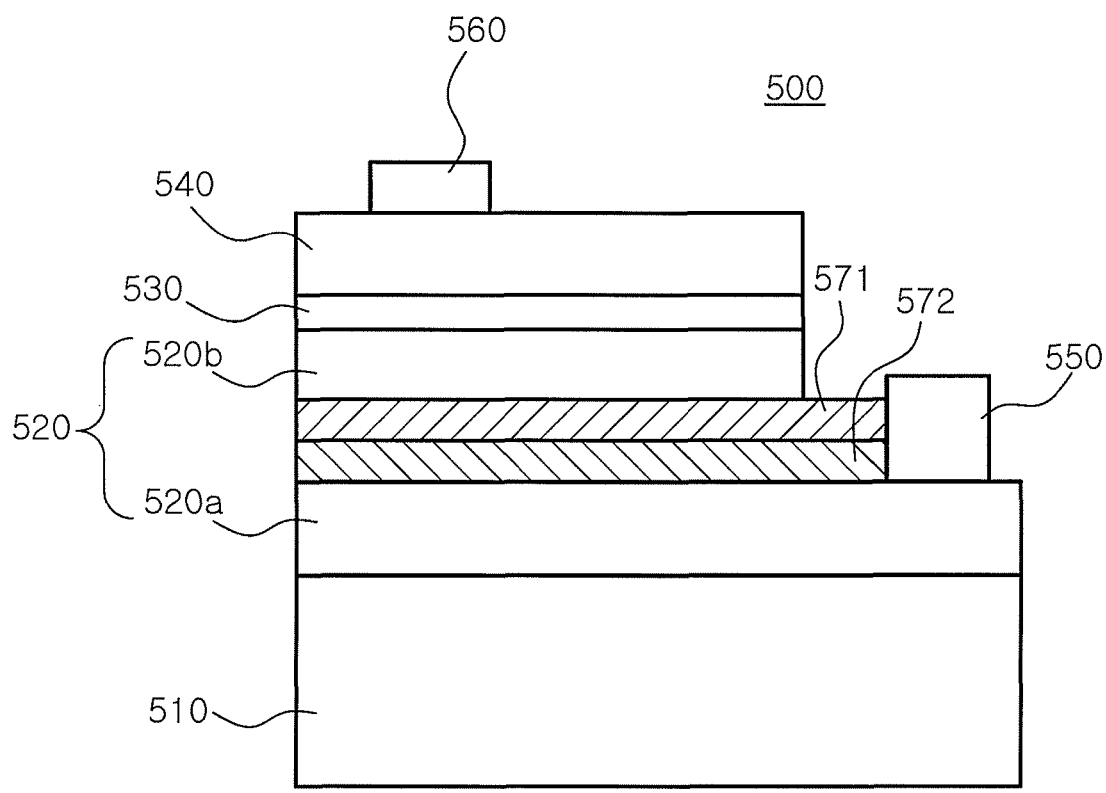
FIG. 5 is a cross-sectional view illustrating a semiconductor light emitting device having a metal layer with a double-layered structure according to a further embodiment of the invention.
Figure 6:
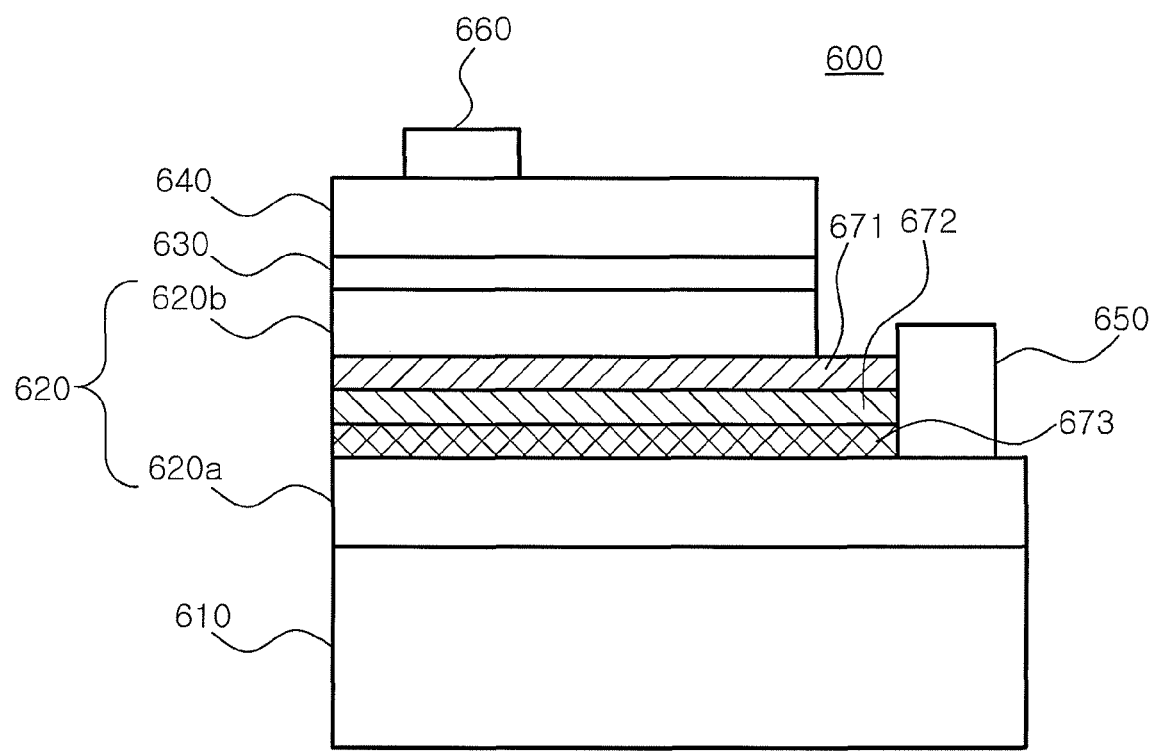
FIG. 6 is a cross-sectional view illustrating a semiconductor light emitting device having a metal layer with a triple-layered structure according to a still further embodiment of the invention.

In FIGS. 5 and 6, a semiconductor light emitting device having a metal layer having a multi-layered structure is shown. In FIG. 5, the metal layer is formed of two layers (571 and 572). In FIG. 6, a metal layer is formed of three layers (671, 672, and 673). In FIGS. 5 and 6, semiconductor light emitting devices 500 and 600 include substrates 510 and 610, n-type semiconductor layers 520 and 620, active layers 530 and 630, p-type semiconductor layers 540 and 640, n-type electrodes 550 and 650, and p-type electrodes 560 and 660, respectively. However, since these components are the same as those described in FIG. 1, a description of the same components will be omitted. Hereinafter, the semiconductor light emitting devices 500 and 600 will be described with reference to FIGS. 5 and 6, respectively.

In FIGS. 5 and 6, at least one of the multiple layers may be formed of Cr, or at least one of the multiple metal layers may be formed of at least one of Mo, Nb, Os, Re, Pd, W, Ta, Hf, and Zr. Among the above-described metals, Cr is a metal that increases adhesion between the metal layer and the semiconductor layer, and Rh has a relatively high reflectivity. Therefore, Cr and Rh are appropriately adjusted to form multiple layers to increase the efficiency of the metal layers.

In FIG. 5, the multi-layered metal layer includes two layers, that is, the first metal layer 571 and the second metal layer 572. As described above, since Cr has excellent thermal resistance and provides excellent adhesion to the semiconductor layer, Cr is preferably used to form the second metal layer 572 that is in contact with a lower n-type semiconductor layer 520a. Further, as described above, since Rh has excellent thermal resistance and high reflectivity, a layer that is located closest to the active layer 530 preferably includes Rh so as to reflect light generated from the active layer 530 upwards.

Therefore, when the first metal layer 571 includes Cr, the second metal layer 572 preferably includes Rh or at least one of Mo, Nb, Os, Re, Pd, W, Ta, Hf, and Zr, or Rh. Alternatively, when the second metal layer 572 is formed of Rh, the first metal layer 571 includes Cr or at least one of Mo, Nb, Os, Re, Pd, W, Ta, Hf, and Zr, or Cr.

In FIG. 6, the semiconductor light emitting device 600 includes a metal layer formed of three layers, that is, an eleventh layer 671, a twelfth layer 672, and a thirteenth layer 673. Since the metal layer is formed of three layers, the eleventh layer 671 includes Cr in consideration of adhesion to a lower n-type semiconductor layer 620a, the twelfth layer 672 includes at least one of metals with excellent thermal resistance, such as Mo, Nb, Os, Re, Pd, W, Ta, Hf, and Zr, and the thirteenth layer 673 preferably includes Rh in consideration of the reflection of light from the active layer 630.

Figure 7:
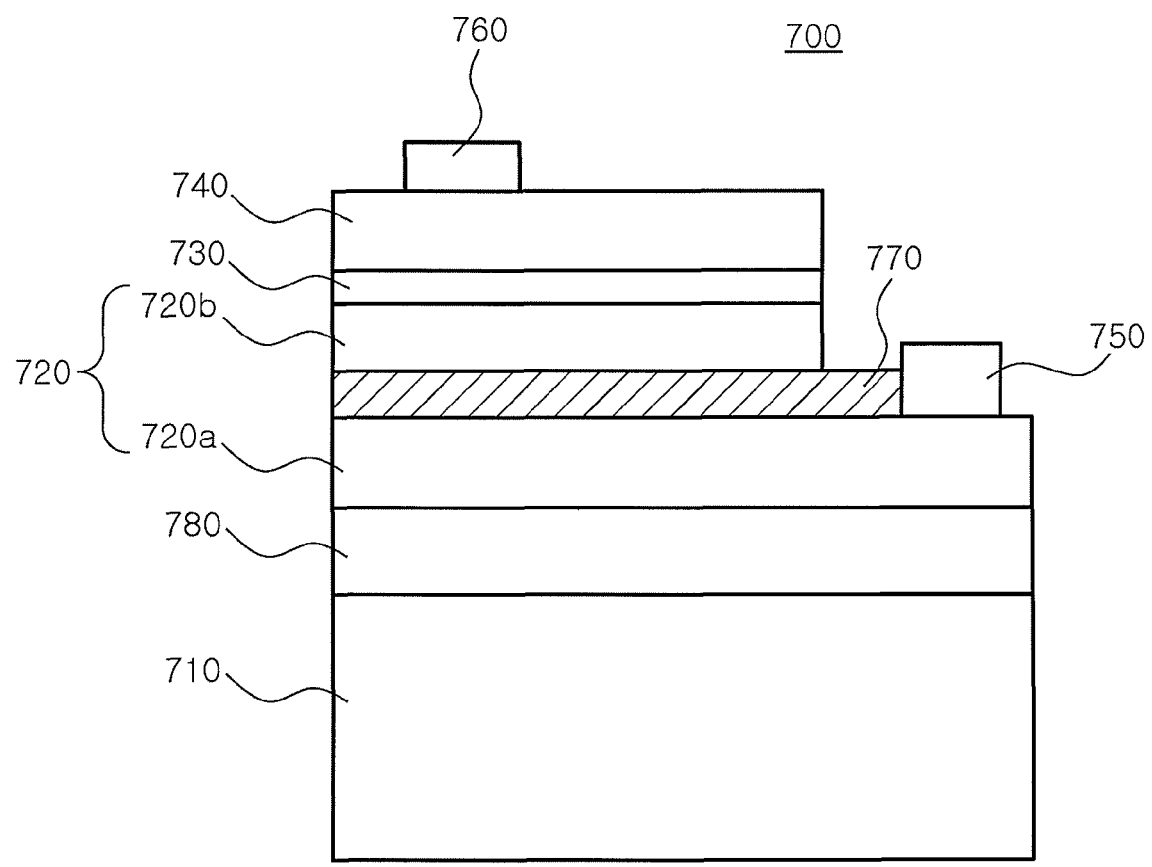
FIG. 7 is a cross-sectional view illustrating a semiconductor light emitting device having a buffer layer according to a yet further embodiment of the invention.

FIG. 7 is a cross-sectional view illustrating a semiconductor light emitting device having a buffer layer according to an exemplary embodiment of the invention. Here, a semiconductor light emitting device 700 includes a substrate 710, an n-type semiconductor layer 720, an active layer 730, a p-type semiconductor layer 740, an n-type electrode 750, a p-type electrode 760, and an electrode layer 770. These components are the same as those described in FIG. 1 except that a buffer layer 780 is further included between the substrate 710 and the n-type semiconductor layer 720. Thus, a description of the same components will be omitted.

The semiconductor light emitting device 700 according to this embodiment may include the buffer layer 780 between the substrate 710 and the n-type semiconductor layer 720. The buffer layer 780 may be formed of an undoped nitride semiconductor material or a nitride semiconductor/carbide material. Further, the buffer layer 780 may be a multilayer film.

A nitride buffer layer is grown at a temperature of 200 to 900° C. A carbide buffer layer is grown at a temperature of 500 to 1500° C. When the buffer layer 780 is grown in this temperature range, a buffer layer with good quality can be obtained, and the semiconductor layers grown on the buffer layer 780 have good surface roughness. Further, the buffer layer 780 can reduce defects caused by dislocations propagating when the n-type semiconductor layer 720 is formed on the substrate 710. Therefore, when the buffer layer 780 and the metal layer 770 are formed on the semiconductor light emitting device 700, it is possible to reduce defects in the semiconductor layers caused by quanta.

As set forth above, according to exemplary embodiments of the invention, a semiconductor light emitting device provides a metal layer within an n-type semiconductor layer so that heat generated during the operation of the semiconductor light emitting device can be efficiently dissipated through the metal layer having high thermal conductivity.

Further, since the metal layer is in contact with an n-type electrode, the metal layer effectively spreads electrons injected into the semiconductor light emitting device from the n-type electrode so that the electrodes supplied to an active layer can be evenly distributed.

Furthermore, when a pattern is formed on the metal layer, dislocations propagating from the substrate of the semiconductor layers can be blocked to thereby reduce defects in the semiconductor layers. Therefore, the light emitting device according to the exemplary embodiment of the invention increases reliability and luminous efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device comprising:
   a substrate;
   a light emitting structure having a first n-type semiconductor layer, a second n-type semiconductor layer, an active layer, and a p-type semiconductor layer sequentially laminated;
   an n-type electrode formed on an exposed upper portion of the second n-type semiconductor layer and a p-type electrode formed on the p-type semiconductor layer; and
   a metal layer formed between the first n-type semiconductor layer and the second n-type semiconductor layer;
   wherein the metal layer is extended to the exposed upper portion of the second n-type semiconductor layer and directly contacts the n-type electrode.

2. The semiconductor light emitting device of claim 1, wherein the substrate comprises sapphire or spinel.

3. The semiconductor light emitting device of claim 1, wherein the substrate comprises any one of SiC, Si, ZnO, GaAs, an GaN.

4. The semiconductor light emitting device of claim 1, wherein the metal layer is in contact with the active layer.

5. The semiconductor light emitting device of claim 1, wherein the metal layer comprises a pattern.

6. The semiconductor light emitting device of claim 5, wherein the pattern is a striped pattern or a mesh pattern.

7. The semiconductor light emitting device of claim 1, wherein the metal layer comprises a metal having a higher melting point than a growth temperature of a semiconductor forming the n-type semiconductor layer.

8. The semiconductor light emitting device of claim 7, wherein the semiconductor is GaN, and the metal has a melting point of 1000° C. or higher.

9. The semiconductor light emitting device of claim 7, wherein the metal includes at least one of Mo, Nb, Os, Re, Pd, W, Ta, Cr, Hf, Rh, and Zr.

10. The semiconductor light emitting device of claim 1, wherein the metal layer has a multilayer structure.

11. The semiconductor light emitting device of claim 10, wherein the metal layer has the multilayer structure including at least one layer formed of Cr.

12. The semiconductor light emitting device of claim 10, wherein the metal layer has the multilayer including at least one layer formed of at least one of Mo, Nb, Os, Re, Pd, W, Ta, Cr, Hf, Rh, and Zr.

13. The semiconductor light emitting device of claim 10, wherein at least one layer, located closest to the active layer, of the metal layer having the multilayer structure is formed of Rh.

14. The semiconductor light emitting device of claim 10, wherein the metal layer having the multilayer structure comprises a first layer formed of Cr, a second layer formed of at least one of Mo, Nb, Os, Re, Pd, W, Ta, Cr, Hf, Rh, and Zr, and a third layer formed of Rh, the first, second, and third layers sequentially laminated.

15. The semiconductor light emitting device of claim 1, further comprising a buffer layer between the substrate and the n-type semiconductor layer.

* * * * *

UNITED STATES PATENT AND TRADEMARK OFFICE
CERTIFICATE OF CORRECTION

PATENT NO. : 8,410,497 B2  
APPLICATION NO. : 12/338438  
DATED : April 2, 2013  
INVENTOR(S) : Sang Won Kang et al.

Page 1 of 1

It is certified that error appears in the above-identified patent and that said Letters Patent is hereby corrected as shown below:

On the Title Page

At Assignee Item (73), please correct the Assignee data to read as follows:

Samsung Electronics Co., Ltd., Seoul, Republic of Korea  
Gwangju Institute of Science and Technology, Gwangju, Republic of Korea Signed and Sealed this  
Fourth Day of March, 2014

Michelle K. Lee  
*Deputy Director of the United States Patent and Trademark Office*